United States Patent
Nong et al.

(10) Patent No.: US 10,566,441 B2
(45) Date of Patent: Feb. 18, 2020

(54) METHODS OF FORMING INTEGRATED CIRCUITS WITH SOLUTIONS TO INTERLAYER DIELECTRIC VOID FORMATION BETWEEN GATE STRUCTURES

(71) Applicant: Globalfoundries Singapore Pte. Ltd., Singapore (SG)

(72) Inventors: Hao Nong, Singapore (SG); Liang Li, Singapore (SG); Chiew Wah Yap, Singapore (SG); Ting Huo, Singapore (SG); Yung Fu Chong, Singapore (SG); Yun Ling Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/896,696

(22) Filed: Feb. 14, 2018

(65) Prior Publication Data

US 2019/0252515 A1 Aug. 15, 2019

(51) Int. Cl.
*H01L 21/28* (2006.01)
*H01L 21/308* (2006.01)
*H01L 21/311* (2006.01)
*H01L 21/673* (2006.01)
*H01L 21/768* (2006.01)
*H01L 21/8234* (2006.01)
*H01L 21/8238* (2006.01)
*H01L 27/088* (2006.01)
*H01L 29/66* (2006.01)

(52) U.S. Cl.
CPC .... *H01L 29/6653* (2013.01); *H01L 21/28132* (2013.01); *H01L 21/28141* (2013.01); *H01L 21/3086* (2013.01); *H01L 21/31144* (2013.01); *H01L 21/6732* (2013.01); *H01L 21/76834* (2013.01); *H01L 21/823468* (2013.01); *H01L 21/823864* (2013.01); *H01L 27/088* (2013.01)

(58) Field of Classification Search
None
See application file for complete search history.

(56) References Cited

U.S. PATENT DOCUMENTS

| | | | | |
|---|---|---|---|---|
| 7,259,050 | B2* | 8/2007 | Chen | H01L 29/6653 257/E29.266 |
| 2009/0017625 | A1* | 1/2009 | Lee | H01L 21/31144 438/694 |
| 2017/0154891 | A1* | 6/2017 | Liao | H01L 29/66825 |
| 2017/0179119 | A1* | 6/2017 | Chang | H01L 21/76802 |

\* cited by examiner

*Primary Examiner* — Stephanie P Duclair
(74) *Attorney, Agent, or Firm* — Thompson Hine LLP

(57) ABSTRACT

Methods of forming integrated circuits are provided herein. In an embodiment, a method of forming an integrated circuit includes providing a semiconductor substrate. The semiconductor substrate includes a plurality of gate structures that have sidewalls spacers disposed adjacent to the gate structures. A gap is defined between sidewall spacers of adjacent gate structures. The method proceeds with decreasing an aspect ratio between a width of the gap at an opening thereto and a depth of the gap, wherein an aspect ratio between a width of the gap at a base of the sidewall spacers and the depth of the gap remains substantially unchanged after decreasing the aspect ratio between the width of the gap at the opening thereto.

11 Claims, 4 Drawing Sheets

METHODS OF FORMING INTEGRATED CIRCUITS WITH SOLUTIONS TO INTERLAYER DIELECTRIC VOID FORMATION BETWEEN GATE STRUCTURES

TECHNICAL FIELD

The technical field generally relates to methods of forming integrated circuits, and more particularly relates to methods of forming integrated circuits that address interlayer dielectric void formation between gate structures.

BACKGROUND

Transistors such as metal oxide semiconductor field effect transistors (MOSFETs) or simply field effect transistors (FETs) or metal oxide semiconductor (MOS) transistors are the core building blocks of the vast majority of semiconductor integrated circuits (ICs). A FET includes source and drain regions between which a current can flow through a channel under the influence of a bias applied to a gate electrode that overlies the channel and that is separated from the channel by a gate dielectric structure. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high-performance microprocessors, can include millions of FETs.

In addition to FETs, ICs also generally include additional functional devices such as memory devices. Flash memory devices, in particular, generally include a floating gate structure formed over a P-channel or an N-channel, with a control gate formed over the floating gate and with a dielectric layer separating the floating gate from both an underlying semiconductor substrate and from the control gate. For such ICs, decreasing transistor size and thus increasing transistor density has traditionally been a high priority in the semiconductor manufacturing industry. As advanced metal-oxide-semiconductor (MOS) technology continues to scale and move into the deep-sub-micron geometry dimensions, advancements to techniques for further decreasing critical dimension (CD) of features have been sought. Especially for so-called planar IC architectures, wherein transistors and memory devices are formed layer-by-layer over and on a semiconductor substrate, efforts to decrease critical dimensions often involve decreasing cross-sectional area of the gate structures as well as decreasing gap spacing between the gate structures. However, as spacing decreases between gate structures, aspect ratios between gate height and gap width between gate structures increase. The increase in aspect ratios between the gate height and gap width between gate structures renders gap fill with dielectric material more difficult, often leading to void formation in an interlayer dielectric layer formed from the dielectric material in the area of the gap between the gate structures. The prevalence of such void formation is of particular concern for gate structures that include multiple distinct gates that are vertically formed over the semiconductor substrate, such as the gate structures in the flash memory devices, due to generally high aspect ratios between the gate height and the gap width between gate structures.

Accordingly, it is desirable to provide methods of forming integrated circuits that address interlayer dielectric void formation between gate structures. In addition, it is desirable to provide methods of forming integrated circuits that are effective to address such void formation without materially impacting sensitive structures that underlie the interlayer dielectric layer that is formed over and between the gate structures. Furthermore, other desirable features and characteristics will become apparent from the subsequent detailed description and the appended claims, taken in conjunction with the accompanying drawings and this background.

BRIEF SUMMARY

Methods of forming integrated circuits are provided herein. In an embodiment, a method of forming an integrated circuit includes providing a semiconductor substrate. The semiconductor substrate includes a plurality of gate structures that have sidewalls spacers disposed adjacent to the gate structures. A gap is defined between sidewall spacers of adjacent gate structures. The method proceeds with decreasing an aspect ratio between a width of the gap at an opening thereto and a depth of the gap, wherein an aspect ratio between a width of the gap at a base of the sidewall spacers and the depth of the gap remains substantially unchanged after decreasing the aspect ratio between the width of the gap at the opening thereto.

In another embodiment, a method of forming an integrated circuit includes providing a semiconductor substrate. The semiconductor substrate includes a plurality of gate structures that have sidewalls spacers disposed adjacent to the gate structures. A gap is defined between sidewall spacers of adjacent gate structures. A mask layer is formed in the gap between the sidewall spacers, wherein a top portion of the sidewall spacers is exposed and a bottom portion of the sidewall spacers is covered by the mask layer after forming the mask layer. The top portion of the sidewall spacers is etched with an etchant that is selective to the sidewall spacers as compared to the mask layer.

In another embodiment, a method of forming an integrated circuit includes providing a semiconductor substrate. The semiconductor substrate includes a plurality of gate structures that have sidewalls spacers disposed adjacent to the gate structures. A gap is defined between sidewall spacers of adjacent gate structures. A mask layer is formed in the gap between the sidewall spacers and over the gate structures, wherein a top portion of the sidewall spacers is covered by the mask layer and a bottom portion of the sidewall spacers is also covered by the mask layer. An etchant is penetrated through the mask layer and into the top portion of the sidewall spacers.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
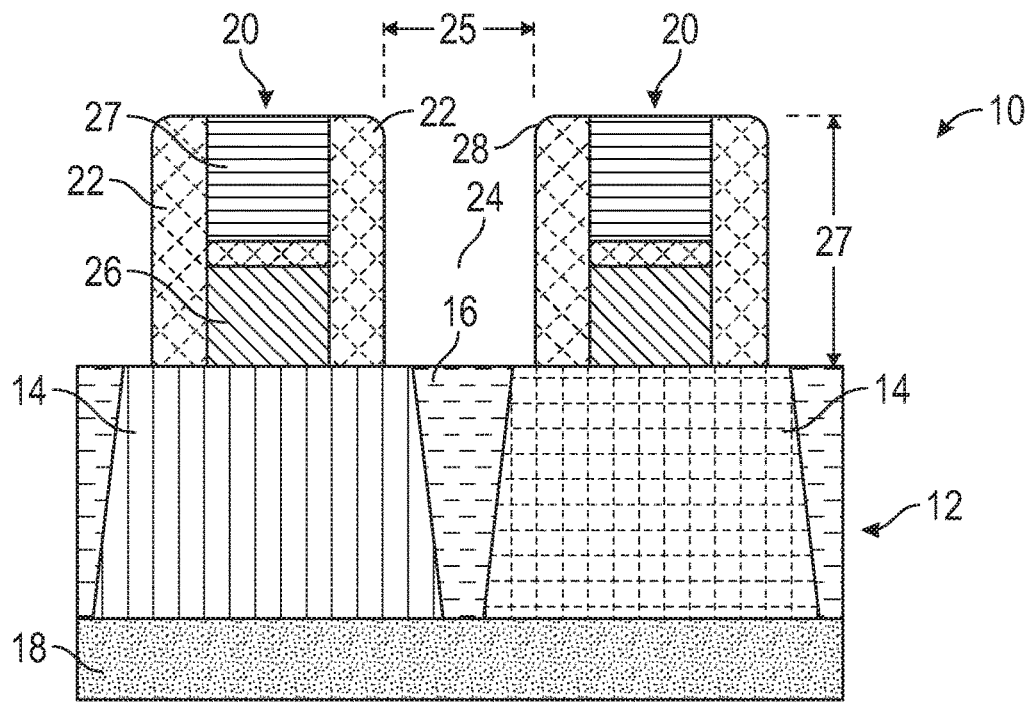
FIGS. 1-5 are schematic cross-sectional side views of an integrated circuit and a method of forming the integrated circuit in accordance with an embodiment.

The following detailed description is merely exemplary in nature and is not intended to limit the embodiments of the present disclosure. Furthermore, there is no intention to be bound by any theory presented in the preceding background or the following detailed description.

Embodiments of the present disclosure are generally directed to integrated circuits and methods for fabricating the same. For the sake of brevity, conventional techniques related to integrated circuit fabrication may not be described in detail herein. Moreover, the various tasks and process steps described herein may be incorporated into a more comprehensive procedure or process having additional steps or functionality not described in detail herein. Various steps in the manufacture of semiconductor-based transistors are well-known and so, in the interest of brevity, many conventional steps will only be mentioned briefly herein or will be omitted entirely without providing the well-known process details.

As used herein, the term "overlying" means "over" such that an intervening layer may lie between the overlying component and the underlying component, or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuits as described herein and as shown in the accompanying figures may be moved such that the relative "up" and "down" positions change, and the integrated circuits can be operated in any orientation. Spatially relative terms, such as "top", "bottom", "over" and "under" are made in the context of the orientation of the cross-sectional figures. It is to be understood that spatially relative terms refer to the orientation in the figures, so if the integrated circuits as shown in the figures were to be oriented in another manner the spatially relative terms would still refer to the orientation depicted in the figures. Thus, the exemplary terms "over" and "under" remain the same even if the device is twisted, flipped, or otherwise oriented other than as depicted in the figures.

Methods of forming integrated circuits are provided herein in which interlayer dielectric void formation between gate structures is minimized or avoided altogether. In particular, in accordance with the methods described herein, sidewall spacers are adjacent to the gate structures with a gap defined between the sidewall spacers. An aspect ratio between a width of the gap at an opening to the gap, i.e., at uppermost points of the sidewall spacers, and a depth of the gap is decreased, which enables more effective filling of the gap with dielectric material while minimizing or avoiding void formation in the resulting interlayer dielectric layer formed from the dielectric material. Further, an aspect ratio between a width of the gap at a base of the sidewall spacers and the depth of the gap remains substantially unchanged after decreasing the aspect ratio between the width of the gap at the opening thereto. In various embodiments as described in further detail below, the aspect ratio at the opening to the gap can be decreased while leaving the aspect ratio at the base of the sidewall spacers unchanged through various uses of a mask layer and selective etching of the sidewall spacers, thereby shielding areas proximate the base of the sidewall spacers from exposure to etchants used to selectively etch the sidewall spacers proximate to the opening to the gap. In this regard, the aspect ratio at the opening to the gap can be decreased to minimize or avoid void formation without materially impacting sensitive structures that underlie the interlayer dielectric layer that is formed over and between the gate structures.

Reference is made to an exemplary embodiment of a method of forming an integrated circuit 10 as illustrated in FIGS. 1-5. In an embodiment and referring to FIG. 1, a semiconductor substrate 12 is provided, where the substrate 12 includes a semiconductor material. As referred to herein, a material that "includes" a recited element/compound includes the recited element/compound in an amount of at least 10 weight percent or more based on the total weight of the material unless otherwise indicated. As used herein, the term "semiconductor material" will be used to encompass semiconductor materials conventionally used in the semiconductor industry to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the substrate 12 primarily includes a monocrystalline semiconductor material. As used herein, a component "primarily" includes a material if that material is more than about 50 weight percent of the component. The substrate 12 may be a thin layer of semiconductor, such as silicon, on an insulating layer (commonly known as semiconductor- or silicon-on-insulator or SOI, as illustrated) that, in turn, is supported by a carrier wafer. Alternatively and although not shown, the substrate 12 may be a bulk silicon wafer. In the embodiment as shown in FIGS. 1-5, the semiconductor substrate 12 includes active regions 14, i.e., p-wells and n-wells, with a shallow trench isolation structure 16 separating the active regions 14. An insulating layer 18 is disposed under the active regions 14.

The semiconductor substrate 12 includes a plurality of gate structures 20 having sidewall spacers 22 disposed adjacent to the gate structures 20, particularly with opposing sidewall spacers 22 disposed on either side of each gate structure 20 in the view as shown in FIGS. 1-5. The views as shown in FIGS. 1-5 are perpendicular to a plane that passes through adjacent gate structures 20, and it is to be appreciated that source and drain regions are disposed in and on the active regions 14 along an axis perpendicular to the plane of the Figures. In embodiments and as shown in FIGS. 1-5, the gate structures 20 have a stacked gate arrangement, with a floating gate 26 and an overlying gate 27 (such as a control gate) disposed in a stacked relationship. Such stacked gate arrangements generally exhibit higher aspect ratios than non-stacked gates between gate width of the gate structure and gate height, or between spacing between the gates and gate height and spacing between gates. As such, the methods as described herein are particularly pertinent to such stacked gate arrangements as the high aspect ratios may correlate to void formation in an interlayer dielectric layer that overlies the gate structures 20.

Referring again to FIG. 1, a gap 24 is defined between sidewall spacers 22 of adjacent gate structures 20. In embodiments, the shallow trench isolation structure 16 is exposed in the gap 24 after formation of the sidewall spacers 22. In embodiments, the gap 24 has an initial aspect ratio of at least 1:3 (gap width 25 to gap depth 27), which may be characteristic of stacked gate arrangements as described above. However, it is to be appreciated that non-stacked gate arrangements may also have the above-referenced aspect ratios. Further, while the methods as described herein may be particularly pertinent to stacked gate arrangements, or gate structures having the aforementioned initial aspect ratio, it is to be appreciated that the methods as described herein are not limited to any initial aspect ratio of the gap 24.

Figure 4:
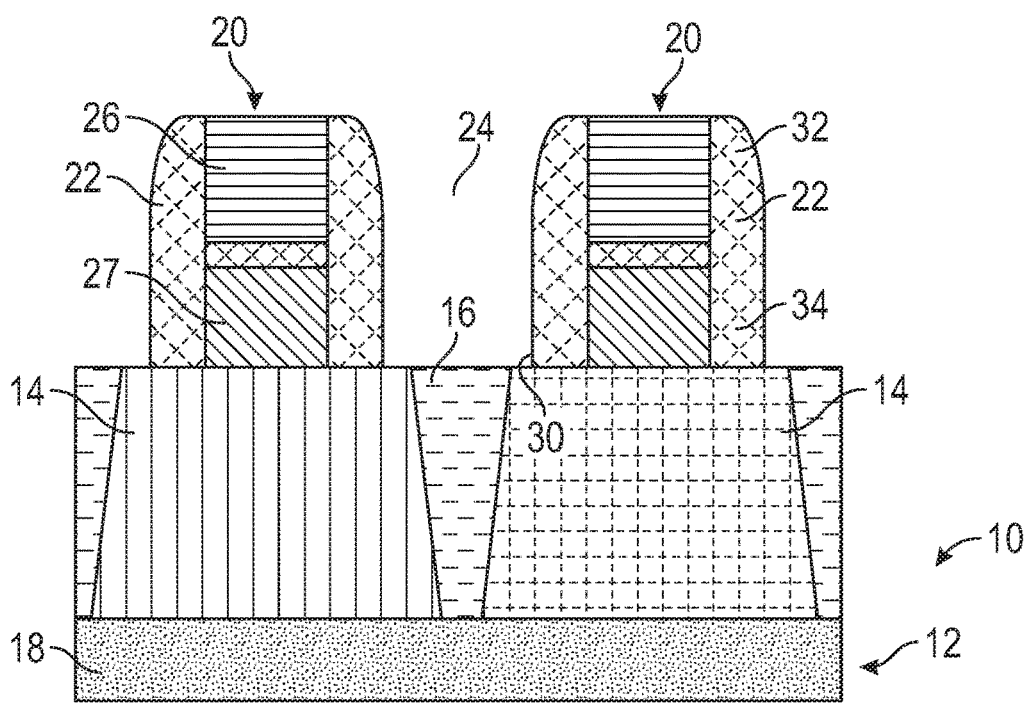
Figure 5:
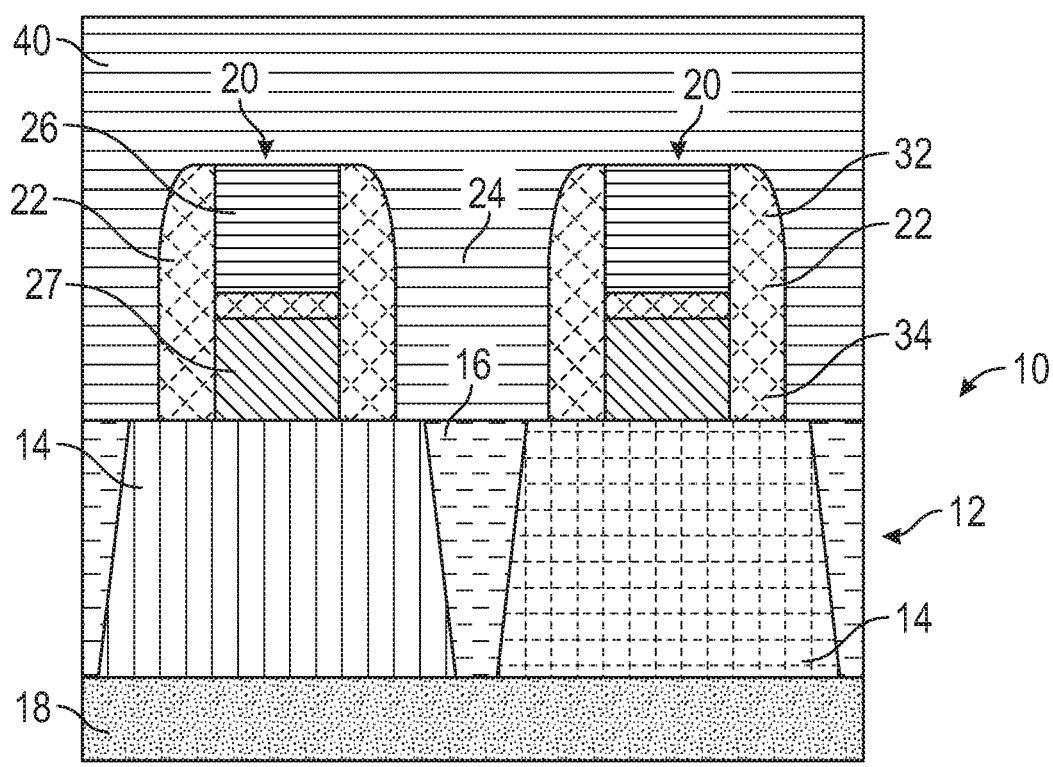
Figure 6:
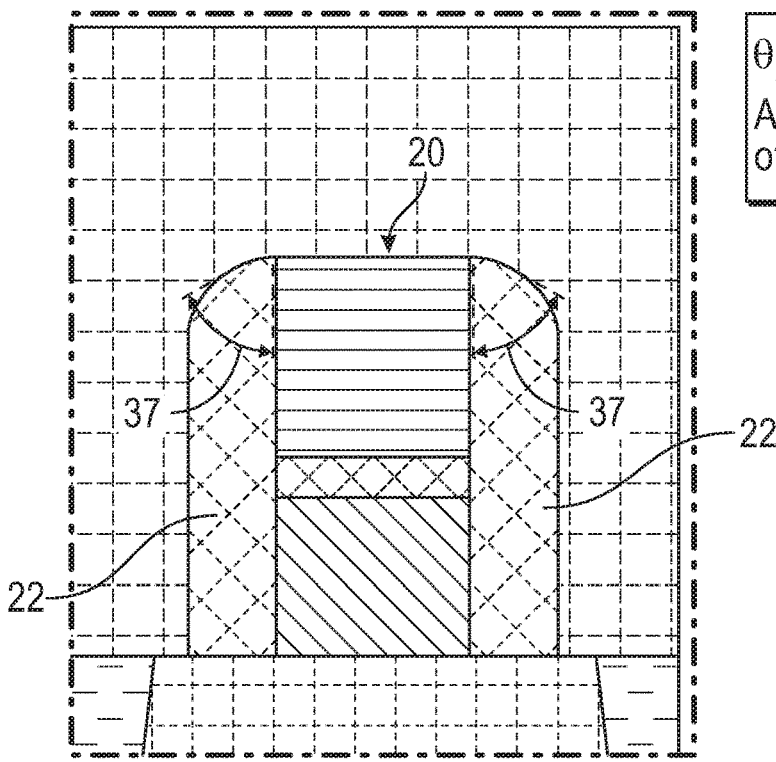
FIG. 6 is a schematic cross-sectional side view of a gate structure having sidewall spacers disposed adjacent thereto prior to etching a top portion of the sidewall spacers in accordance with an embodiment.

In accordance with the methods as described herein, the aspect ratio between the width 25 of the gap 24 at an opening 28 thereto and the depth 27 of the gap 24 is decreased, while an aspect ratio between the width 25 of the gap 24 at a base 30 of the sidewall spacers 22 and the depth 27 of the gap 24 remains substantially unchanged after decreasing the aspect ratio between the width 25 of the gap 24 at the opening 28 thereto. In particular, the aspect ratio at the opening 28 can be decreased by increasing a pitch of the sidewall spacers 22 at a top portion 32 thereof, for example by employing an appropriate selective etching technique to etch the sidewall spacers 22 at the top portion 32, with pitch of the sidewall spacers 22 at a bottom portion 34 thereof is substantially unchanged. Referring to FIGS. 4 and 6, in embodiments portions of the sidewall spacer 22 are left disposed adjacent the gate structure 20 along the entire height thereof. Specific embodiments for decreasing the aspect ratio are described below. By effectively decreasing the aspect ratio of the gap 24 only at the opening 28, the semiconductor substrate 12 is unaffected by techniques employed to decrease the aspect ratio. As such, void formation in the subsequently formed interlayer dielectric layer can be addressed without impacting the semiconductor substrate.

Figure 2:
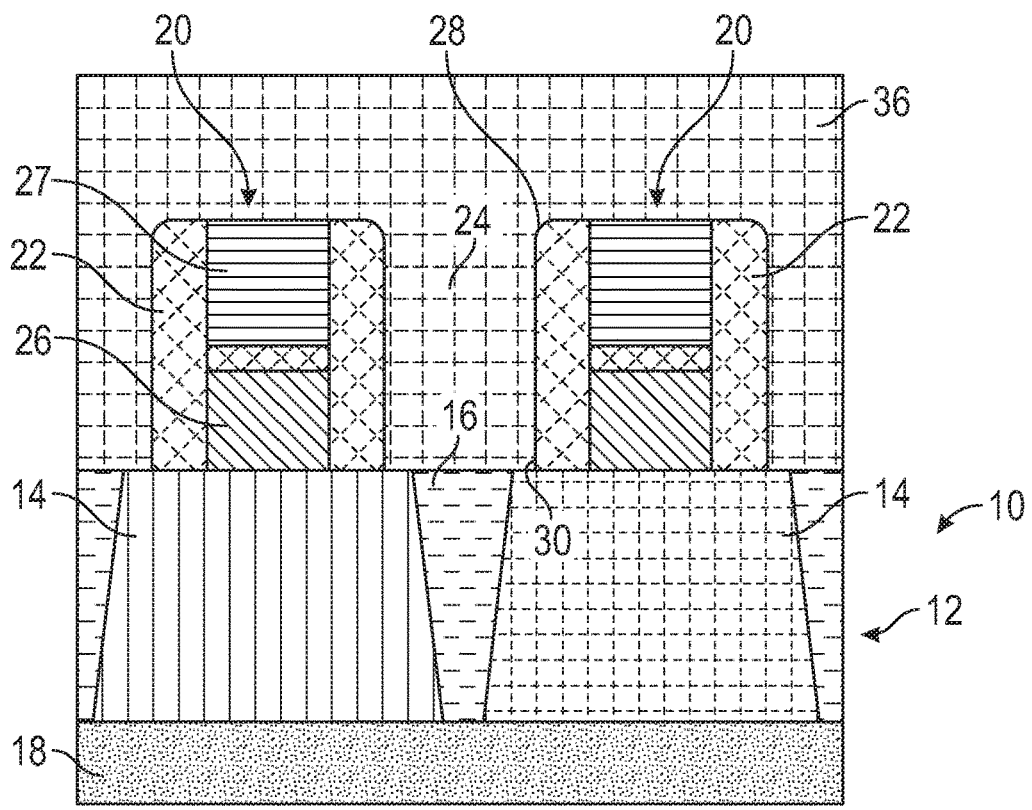
Figure 3:
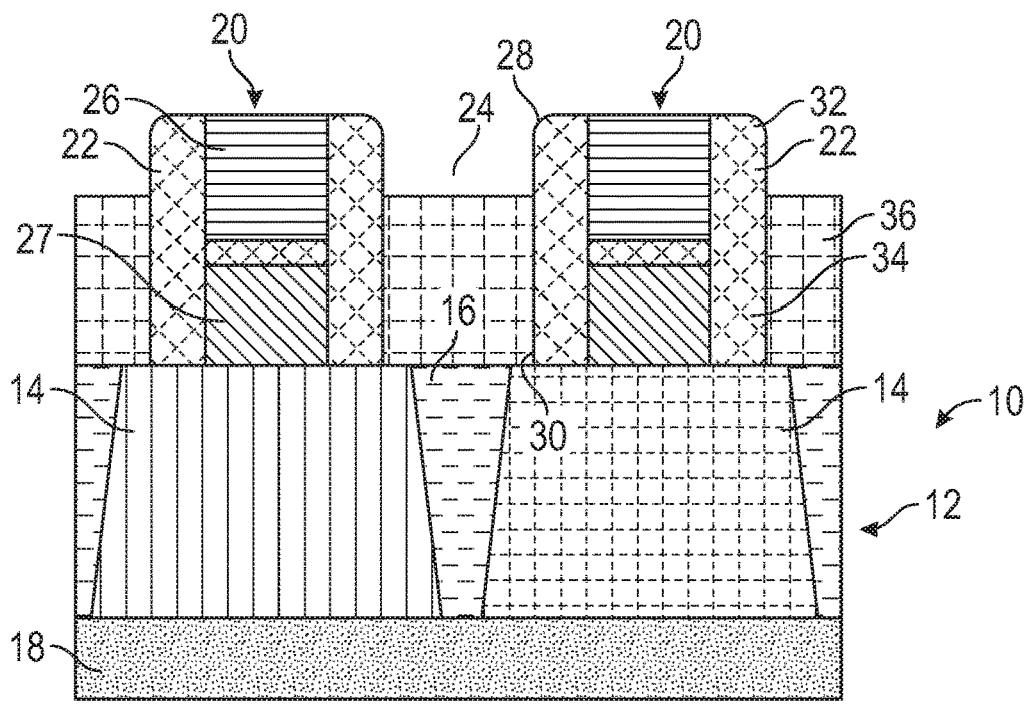

There are various approaches to decreasing the aspect ratio between the width 25 of the gap 24 at the opening 28 to the gap 24 and the depth 27 of the gap 24. In an embodiment and referring to FIG. 2, a mask layer 36 is deposited in the gap 24 between the sidewall spacers 22 prior to decreasing the aspect ratio. The mask layer 36 may be formed from an organic resist material, such as a photoresist material. In the embodiment as shown in FIG. 2, the mask layer 36 is deposited in the gap 24 and over the gate structures 20. Referring to FIG. 3, in an embodiment, the mask layer 36 is recessed, or partially removed, to expose the top portion 32 of the sidewall spacers 22 while leaving the bottom portion 34 of the spacers covered by the mask layer 36. With the bottom portion 34 covered, selective etching does not remove material from the bottom portion 34, or does not remove material at the same rate as material removal from the top portion 32. The mask layer 36 may be recessed through a conventional organic resist removal technique, such as an oxygen-containing plasma.

The exposed top portion 32 of the sidewall spacers 22 is etched after recessing the mask layer 36. In embodiments, etch techniques are employed that taper the sidewall spacers in a shoulder area, at the opening 28 to the gap 24, to leave the bulk of the sidewall spacers 22 in place while increasing the pitch of the sidewall spacers 22. As such, in embodiments, the etching technique that is employed is controllable to taper the sidewall spacers 22 without removing the entire top portion of the sidewall spacers 22 that is exposed outside of the mask layer 36. Suitable etchants include those that are selective to the sidewall spacers 22, which are conventionally formed of silicon nitride, over the mask layer 36, which may be an organic resist material. As such, in embodiments, the etchant capable of etching silicon nitride. One example of a suitable etchant is dilute hydrofluoric acid (DHF). In an embodiment, a wet etch technique is employed and the etching technique is isotropic. In another embodiment, a dry etching technique is employed, and the etching technique may be anisotropic.

Figure 7:
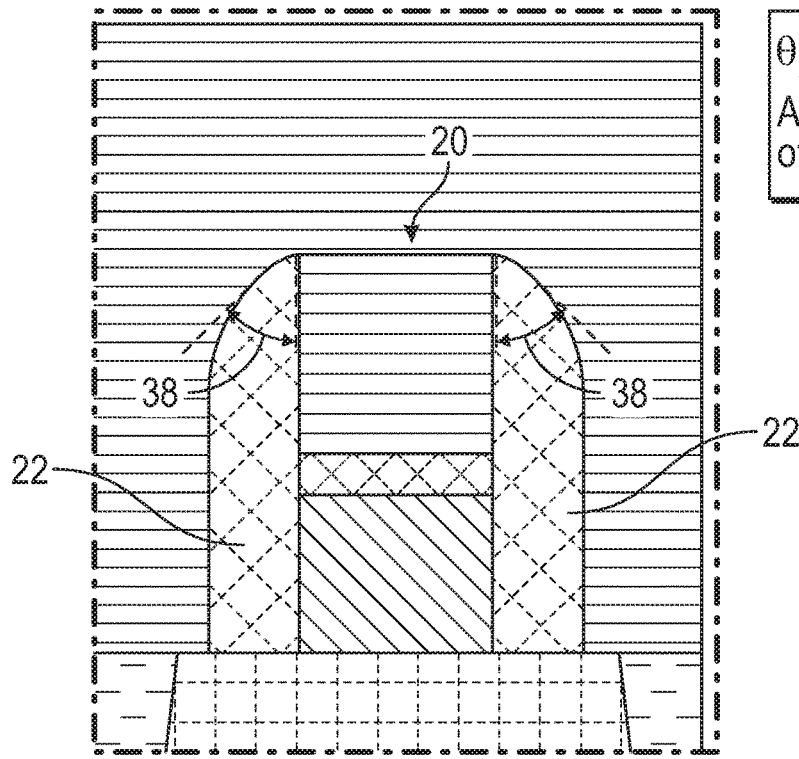
FIG. 7 is a schematic cross-sectional side view similar to FIG. 6 after etching the top portion of the sidewall spacers.

Referring momentarily to FIGS. 6 and 7, the sidewall spacers 22 are shown in FIG. 6 prior to etching, and FIG. 7 shows the sidewall spacers 22 after etching the top portion 32 thereof. In embodiments, a pitch 37 of the sidewall spacers 22 prior to etching is greater than about 45 degrees, as measured from a vertical sidewall of the gate structure 20 and as shown in FIG. 6. After etching, a pitch 38 of the sidewall spacers 22 after etching is less than about 45 degrees, such as less than 40 degrees, or such as from about 10 to about 45 degrees, as measured from the vertical sidewall of the gate structure 20 and as shown in FIG. 7. With the decrease in pitch 38 is a commensurate decrease in aspect ratio between the width of the gap at the opening thereto and the depth of the gap.

Referring to FIG. 4, after etching the exposed top portion 32 of the sidewall spacers 22, the remaining mask layer 36 is removed. As indicated above, the mask layer 36 may be the organic resist material and can be removed using a conventional organic resist etchant and etching technique. After removing the mask layer 36, fabrication of the integrated circuit 10 may proceed through conventional techniques. For example, referring to FIG. 5, an interlayer dielectric layer 40 is formed over the plurality of gate structures 20 and in the gap 24 after removing the remaining mask layer 36.

In another embodiment, the mask layer 36 is not recessed below a top surface of the gate structure 20 prior to etching the top portion 32 of the sidewall spacers 22, but rather the aspect ratio is decreased by penetrating an etchant through the mask layer 36 and into the top portion 32 of the sidewall spacers 22. In this embodiment, the mask layer 36 may be formed as shown in FIG. 3, with or without partial etching of the mask layer 36 to yield a thickness that still covers the gate structures but that is thin enough to penetrate an etchant through the mask layer 36. As an example, DHF can be penetrated through the mask layer 36 and into the top portion 32 of the sidewall spacers 22. The top portion 32 of the sidewall spacers 22 is effectively etched to increase the pitch thereof by penetrating the etchant through the mask layer 36 in this embodiment to decrease the aspect ratio between the width 25 of the gap 24 at the opening 28 thereto and the depth 27 of the gap 24. The method may then proceed with removing the mask layer 36 after penetrating the etchant through the mask layer 36, followed by forming the interlayer dielectric layer 40 over the plurality of gate structures 20 and in the gap 24.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. A method of forming an integrated circuit, the method comprising:
   providing a semiconductor substrate including a plurality of gate structures having sidewalls spacers disposed adjacent thereto, wherein a gap is defined between sidewall spacers of adjacent gate structures and wherein the sidewall spacers of adjacent gate structures are completely separated by the gap;
   depositing a mask layer in the gap between the sidewall spacers;

recessing the mask layer to expose a top portion of the sidewall spacers; and decreasing an aspect ratio between a width of the gap at an opening thereto and a depth of the gap after providing the semiconductor substrate having the sidewall spacers, depositing the mask layer, and recessing the mask layer, wherein an aspect ratio between a width of the gap at a base of the sidewall spacers and the depth of the gap remains substantially unchanged after decreasing the aspect ratio between the width of the gap at the opening thereto, and wherein decreasing the aspect ratio comprises etching the top portion of the sidewall spacers after recessing the mask layer; and removing the remaining mask layer after etching the top portion of the sidewall spacers.

2. The method of claim 1, further comprising:

forming an interlayer dielectric layer over the plurality of gate structures and in the gap after removing the remaining mask layer.

3. The method of claim 1, wherein the mask layer is also deposited over the gate structures.

4. The method of claim 1, wherein the sidewall spacers are etched with an etchant capable of etching silicon nitride.

5. The method of claim 1, further comprising:

forming an interlayer dielectric layer over the plurality of gate structures and in the gap after removing the remaining mask layer.

6. The method of claim 1, wherein the mask layer is an organic resist material.

7. The method of claim 1, wherein each of the gate structures comprises a stacked gate arrangement with a floating gate and an overlying gate.

8. The method of claim 1, wherein the gap has an initial aspect ratio of at least 1:3.

9. A method of forming an integrated circuit, the method comprising:

providing a semiconductor substrate including a plurality of gate structures having sidewalls spacers disposed adjacent thereto, wherein a gap is defined between sidewall spacers of adjacent gate structures;

forming a mask layer in the gap between the sidewall spacers and over the gate structures, wherein a top portion of the sidewall spacers is covered by the mask layer and a bottom portion of the sidewall spacers is also covered by the mask layer; and penetrating an etchant through the mask layer and into the top portion of the sidewall spacers.

10. The method of claim 9, further comprising:

removing the mask layer after penetrating the etchant through the mask layer.

11. The method of claim 9, wherein the etchant is hydrofluoric acid.

* * * * *